United States Patent

Vogt

[11] Patent Number: 5,844,411
[45] Date of Patent: Dec. 1, 1998

[54] DIAGNOSTIC DETECTION FOR HALL EFFECT DIGITAL GEAR TOOTH SENSORS AND RELATED METHOD

[75] Inventor: Carl Randall Vogt, Raleigh, N.C.

[73] Assignee: Borg-Warner Automotive, Inc., Sterling Heights, Mich.

[21] Appl. No.: 455,049

[22] Filed: May 31, 1995

[51] Int. Cl.⁶ .............. H01H 31/02; G01P 3/44; G01P 3/48; G01B 7/00
[52] U.S. Cl. ............. 324/537; 324/207.2; 324/207.12
[58] Field of Search ............... 324/207.2, 251, 324/207.21, 252, 207.12, 173, 174, 166, 207.25, 160, 537; 327/510, 511; 338/32 R, 32 H

[56] References Cited

U.S. PATENT DOCUMENTS

| | | | |
|---|---|---|---|
| 3,863,109 | 1/1975 | Emanuel et al. | 317/14 R |
| 4,223,255 | 9/1980 | Goldman et al. | 318/138 |
| 4,338,552 | 7/1982 | Pilz et al. | 318/266 |
| 4,648,366 | 3/1987 | Thornton-Trump | 123/335 |
| 4,786,868 | 11/1988 | Nield | 324/161 |
| 4,937,750 | 6/1990 | Gilliam | 364/424.1 |
| 4,966,041 | 10/1990 | Miyazaki | 324/207.2 X |
| 5,011,302 | 4/1991 | Mott et al. | 384/448 |
| 5,130,933 | 7/1992 | Kitano | 324/207.25 X |
| 5,157,966 | 10/1992 | Lugosi et al. | 73/118.1 |
| 5,164,903 | 11/1992 | Lin et al. | 364/426.03 |
| 5,215,160 | 6/1993 | Williams et al. | 180/197 |
| 5,218,298 | 6/1993 | Vig | 324/251 |
| 5,247,245 | 9/1993 | Nelson | 324/133 |
| 5,275,252 | 1/1994 | Sperduti et al. | 180/197 |
| 5,275,253 | 1/1994 | Sperduti et al. | 180/197 |
| 5,303,794 | 4/1994 | Hrovat et al. | 180/197 |
| 5,418,453 | 5/1995 | Wise | 324/160 |

FOREIGN PATENT DOCUMENTS

| | | | |
|---|---|---|---|
| 0577256A1 | 1/1994 | European Pat. Off. | B60K 17/348 |
| 2681990A1 | 4/1993 | France | H03B 7/00 |
| 3841815A1 | 7/1989 | Germany | B60K 23/08 |
| 4327181A1 | 2/1995 | Germany | G01R 33/07 |
| 61-3067 | 1/1986 | Japan . | |

OTHER PUBLICATIONS

*Electrical Design News*, vol. 30, No. 16, Jul. 1985, US, p. 282.

Primary Examiner—Walter E. Snow
Attorney, Agent, or Firm—Brinks, Hofer, Gilson & Lione; Greg Dziegielewski

[57] ABSTRACT

The present invention provides a diagnostic circuit for detecting fault conditions in a Hall effect digital gear tooth sensor in a vehicle's four-wheel drive system. The diagnostic circuit includes a voltage divider circuit connected to a window comparator circuit which is interfaced with a four-wheel drive system controller. Fault conditions, normally difficult to detect in a Hall effect sensor because of the usual open collector configuration, are detected and identified depending on the type and location of the fault. In an alternate embodiment, a safety feature is added to the voltage divider circuit to indicate a fault and prevent gear shifting in the event that the supply voltage and ground wires are inadvertently reversed.

9 Claims, 3 Drawing Sheets

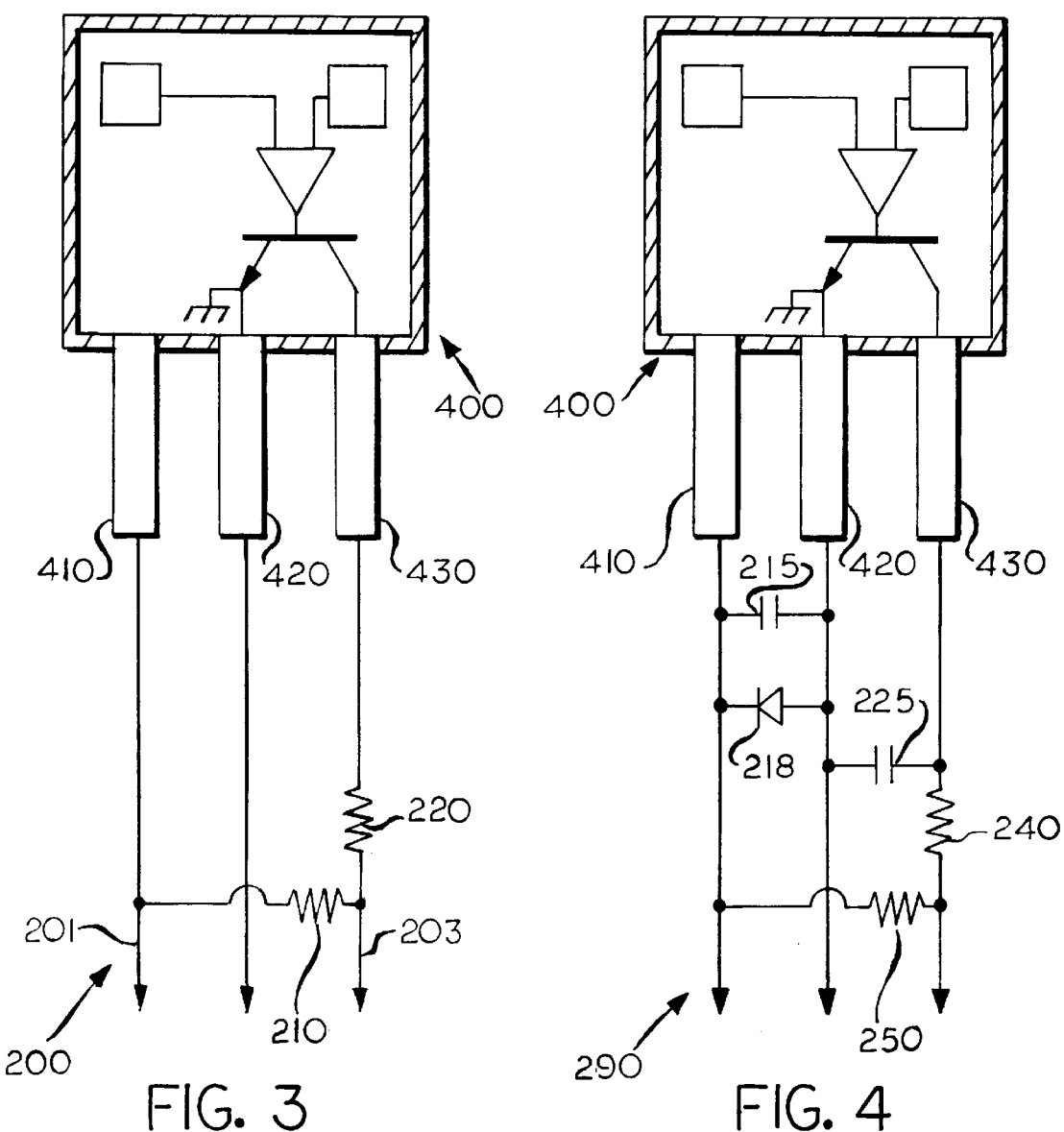
FIG. 3
FIG. 4
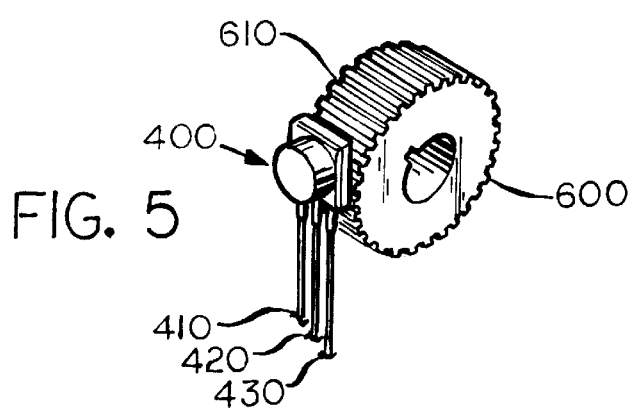
FIG. 5

DIAGNOSTIC DETECTION FOR HALL EFFECT DIGITAL GEAR TOOTH SENSORS AND RELATED METHOD

BACKGROUND

The present invention relates generally to Hall effect sensors and their function as digital gear tooth sensors in four-wheel drive transfer cases. More specifically, the present invention relates to a diagnostic circuit for detecting fault conditions in a circuit employing Hall effect sensors as described above.

The advantages of four-wheel drive in light trucks, sport utility vehicles, off-road vehicles and passenger cars is generally acknowledged. Improved vehicle stability and control extends the vehicle safety envelope when road conditions are wet, snowy, or icy, for example, and extends the terrain capabilities in off-road applications.

There are generally three types of four-wheel drive systems: part-time (which allows shifts to and from 2H, 4H, and 4L); full time (which allows shifts only to and from 4H and 4L); and, torque on demand (which is similar to part-time, but automatically shifts to 4H or 4L when wheels start spinning).

Most proponents of four-wheel drive acknowledge that the need for and benefits of four-wheel drive systems are infrequent. Thus, four-wheel drive systems which primarily utilize two driving wheels and which can be shifted into four-wheel drive by the vehicle operator or by a control system satisfy most four-wheel drive demands. Accordingly, the design of such intermittent, i.e., part-time, four-wheel drive systems focuses attention on the mechanical components which implement the shift from two-wheel drive to four-wheel drive, and, if it is an automatically engaging system, its control system.

Regardless of the four-wheel drive system employed, special problems are created if the vehicle is to be shifted "on the fly," that is, while the vehicle is moving. The shifting requires precise coordination during this transition period, since the front and rear axle may be rotating at different speeds and a drive train must be coupled with an intermittent-drive axle. Especially troublesome is when shifting to and from 4L. Because the 4L setting is geared so low, damage can be done to transfer case gears and passengers can be injured if shifted at a vehicle speed which is too great.

Most shiftings are coordinated by a sophisticated microprocessor system (also known as the system controller) which analyzes the relevant variables input by system sensors and then makes the proper adjustments to allow for trouble-free shifting. To prevent the problems described above, the system controller prevents shifting to and from 4L when vehicle speed exceeds a predetermined safety limit. Of course, as with any complex computer-controlled system, the accuracy of the inputs to that system are critical. One common sensor type frequently used in a four-wheel drive system is the Hall effect sensor, which is particularly well-suited for measuring rotational speed and can be easily adapted to measure the speed of axles or drive shafts. For example, a gear can be attached to one of the drive shafts inside the transfer case and a Hall effect gear tooth sensor can monitor the rotational speed of the gear, thus determining the rotational speed of the drive shaft and axle. That information can then be sent to the system controller to assist in the control of the shifting process.

One disadvantage of using a Hall effect sensor for determining the rotational speed of axles or drive shafts is related to diagnostics. A Hall effect sensor usually utilizes a transistor configured with a common collector output which makes it difficult to detect fault conditions (both open circuits and shorts) in the wiring to the sensor or in the sensor itself.

For the foregoing reasons, there is a need for a diagnostic device able to detect fault conditions in a Hall effect gear tooth sensor and related circuitry.

SUMMARY

The present invention provides a diagnostic circuit for detecting faults in the wiring to a digital Hall effect gear tooth sensor circuit or faults in the sensor itself.

A typical four-wheel drive vehicle has a front and rear drive shaft which transfer rotational torque to the front and rear axles, respectively. The drive shafts are both connected to the transfer case of the vehicle, usually via universal joints and transfer case output shafts. A gear can be located in the transfer case attached to either the front or rear output shaft so that its rotational speed can be monitored. A Hall effect gear tooth sensor for monitoring the rotational speed of the output shaft is mounted on the sidewall of the transfer case. The diagnostic circuit of the present invention includes a voltage divider circuit which is physically located within the Hall effect sensor package and connected to the output of the sensor. The voltage divider circuit is connected to a window comparator circuit which monitors voltage levels and then generates a signal if the voltage exceeds a predetermined upper limit or falls below a predetermined lower limit. The window comparator circuit is interfaced with the system controller, a microprocessor used to monitor various vehicle parameters and control the shifting from two-wheel drive to four-wheel drive and back again. The diagnostic circuit is designed such that a fault, whether it be a short circuit or an open circuit, causes the voltage at specific points to fall below or rise above the predetermined values. When the window comparator circuit detects a voltage level outside the specific range of values, it provides a signal to the system controller. The system controller then sends a signal to an indicator which alerts the driver of the vehicle that a problem exists.

In an alternate embodiment, a safety feature is added to the voltage divider circuit. In the event that the supply voltage and ground wires are inadvertently reversed, the comparator window circuit detects a voltage outside the specified range and sends a signal to the system controller, in much the same manner as when the diagnostic circuit handles a fault condition. The system controller then prevents the shifting of the vehicle until the problem is corrected.

Accordingly, it is an object of the present invention to provide a diagnostic circuit which will detect a fault condition in a Hall effect gear tooth sensor in a four-wheel drive system and then indicate the fault to the operator of the vehicle.

For a further understanding of the present invention and the objects thereof, attention is directed to the drawings and the following brief description thereof, to the detailed description and to the appended claims.

BRIEF DESCRIPTION OF THE DRAWINGS

FIG. 3 is a combination block diagram/electrical schematic diagram of the sensor and voltage divider circuit of the preferred embodiment of the present invention;

FIG. 4 is a combination block diagram/electrical schematic diagram of the sensor and voltage divider circuit of an alternate embodiment of the present invention;

FIG. 5 is a perspective view of the Hall effect gear tooth sensor and the gear relating to the present invention.

DETAILED DESCRIPTION

Figure 1:
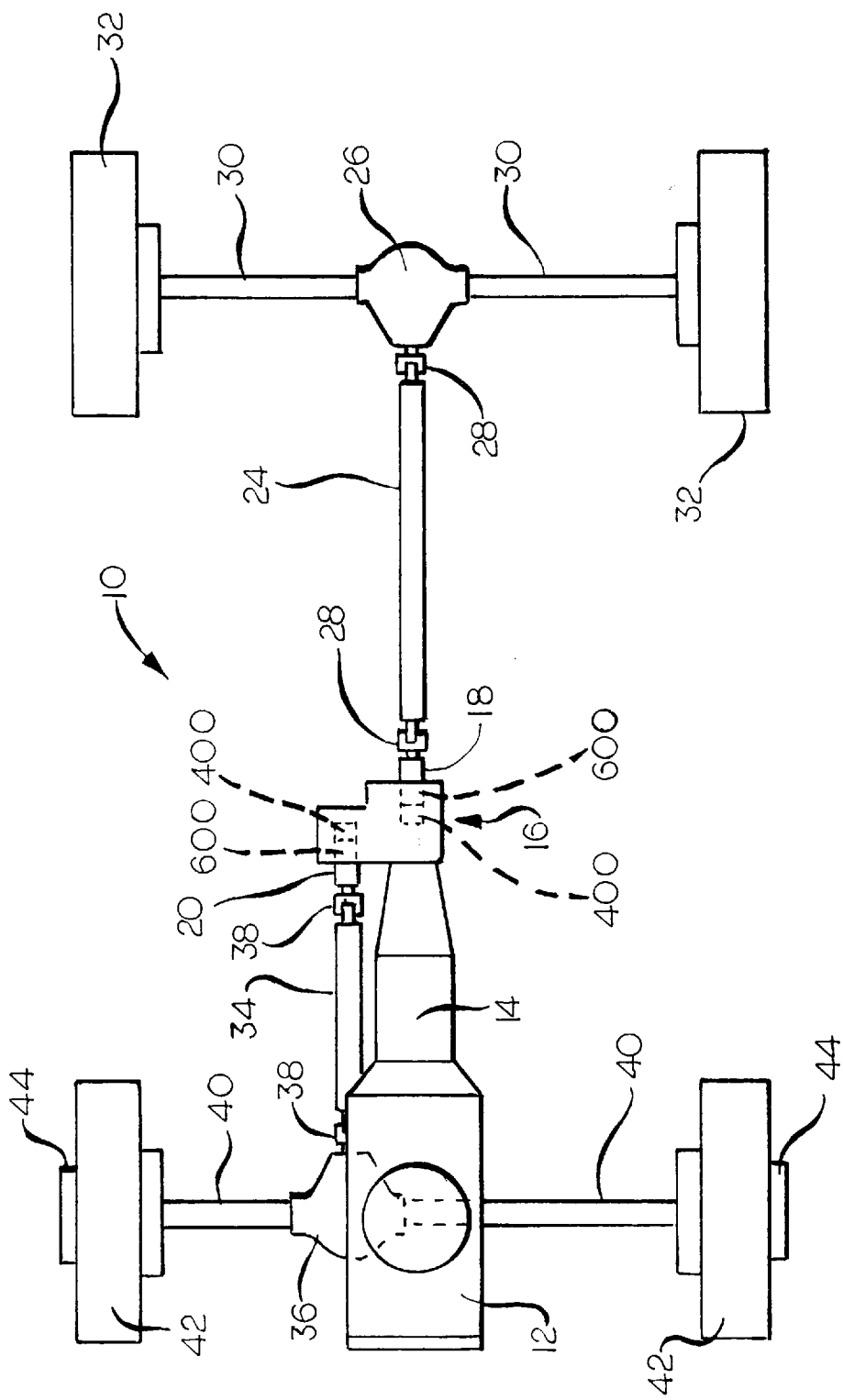
FIG. 1 is a block diagram of a conventional vehicle drive system, in which the present invention is utilized.

A typical vehicle drive system is illustrated and generally designated by the reference numeral 10 in FIG. 1. Vehicle drive system 10 includes a prime mover such as internal combustion engine 12 having an output which is operably coupled to transmission 14. Transmission 14 has an output which, in turn, is operably coupled to transfer case assembly 16. Transfer case assembly 16 includes primary, rear output shaft 18 and secondary, front output shaft 20. Inside transfer case 16, toothed gears 600 are meshed with each of rear output shaft 18 and front output shaft 20. One Hall effect sensor 400 of the present invention for each of gears 600 determines the rotational speed of each gear. Rear output shaft 18 of transfer case 16 drives rear drive shaft 24 which delivers power to rear differential 26. Universal joints 28 are utilized as necessary and in accordance with conventional practice to couple rear output shaft 18 to rear differential 26. The output of rear differential 26 is coupled through rear drive axles 30 to a pair of rear tire and wheel assemblies 32. Similarly, front output shaft 20 of transfer case 16 drives front drive shaft 34 which delivers power to front differential 36. Again, appropriate universal joints 38 are utilized as necessary in accordance with conventional practice to couple front output shaft 20 to front differential 36. Front differential 36 delivers through a pair of front tire and wheel assemblies 42 to a respective pair of locking hubs 44. Locking hubs 44 may be either manually or automatically activated.

Diagnostic circuit 100 of the present invention begins with voltage divider circuit 200 built within and connected to Hall effect digital gear tooth sensor 400. Voltage divider circuit 200 is connected to window comparator circuit 300. The output of window comparator circuit 300 is either interfaced with system controller 500 (which may be a microprocessor of conventional design) or connected directly to indicating components (not shown) for alerting the vehicle operator to problems as they arise.

Figure 2:
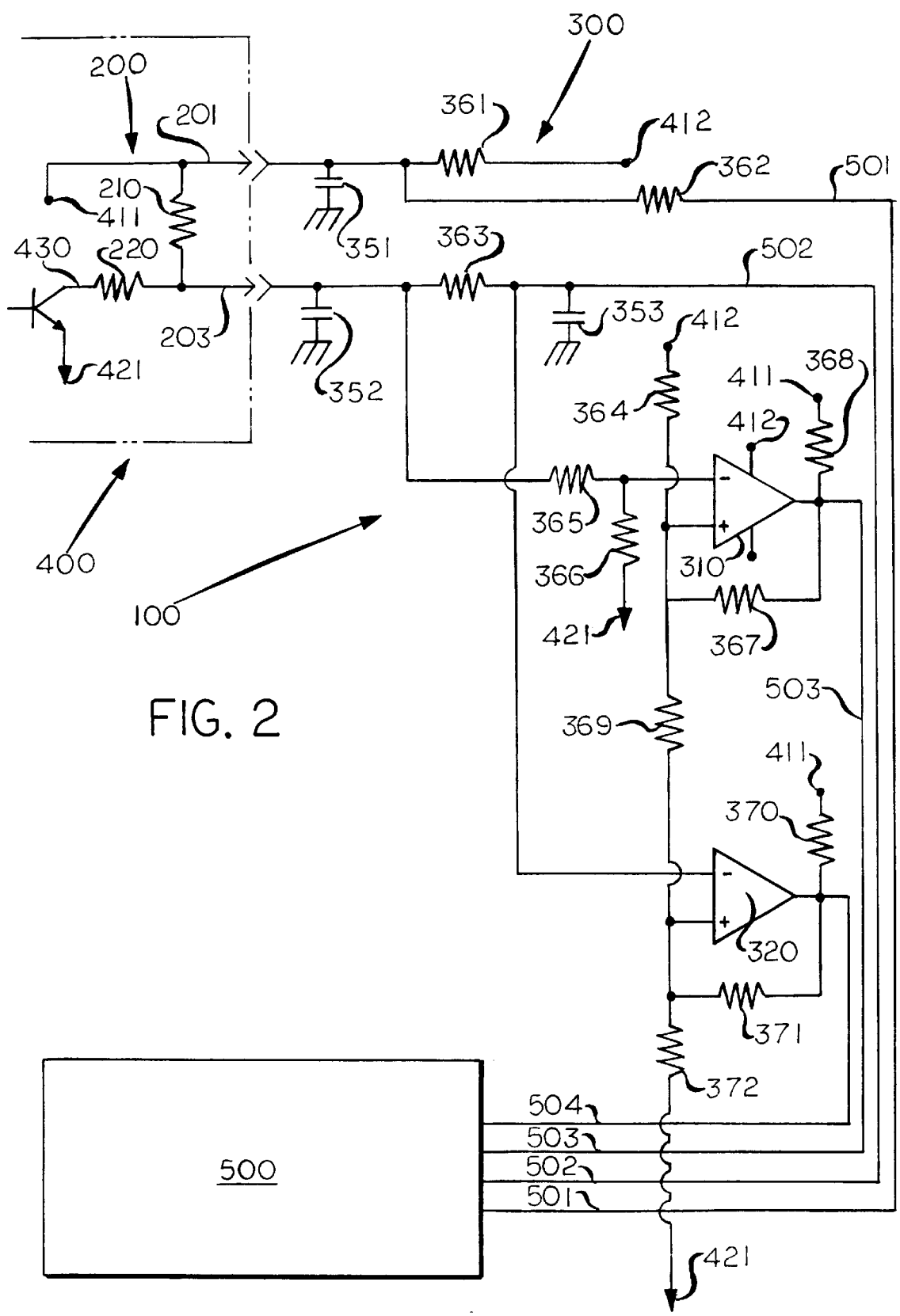
FIG. 2 is an electrical schematic diagram of the present invention.

Sensor 400, shown in FIGS. 2 and 3, is an off-the-shelf item dedicated to the specific function of monitoring the rotation of a toothed gear. For example, Allegro MicroSystems, Inc. models 3046, 3056, or 3058 are suitable for the function of monitoring the rotational speed of teeth 610 of gear component 600 of a four-wheel drive system, shown in FIG. 5. Sensor 400 contains monolithic integrated circuits that switch in response to differential magnetic fields created by ferrous targets. Sensor 400 is packaged with a 3-terminal configuration, best shown in FIGS. 4 and 5. Terminal 410 corresponds to supply voltage 411 ($v_{cc1}$) which is typically 5 v; terminal 420 corresponds to ground 421, i.e. common return; and, terminal 430 corresponds to output 431 of sensor 400. The three terminals of sensor 400 are connected to voltage divider circuit 200.

Power supply 412 ($v_{cc2}$) for sensor 400 is typically 5 vdc. Current limiting resistor 361, preferable having a value of 20Ω and a rating of 2W, is usually employed in the event that a short to ground occurs.

A schematic diagram of voltage divider circuit 200 is shown in FIGS. 2 and 3. Series resistor 210, preferably having a value of 685Ω in the preferred embodiment, and pull-up resistor 220, preferably having a value of 10KΩ, are connected at speed sensor 400 as shown. Additionally, a pull-down resistance of 40KΩ is used: in this case, two pull-down resistors 365 and 366, each having a value of 20KΩ are connected in series and tied to ground 421 at system controller 500. Voltage divider circuit 200 limits the voltage output swing, typically, to 4.0 vdc for the upper limit and 0.4 vdc for the lower limit.

In an alternate embodiment, a safety feature is added to voltage divider circuit 290 as shown in FIG. 4. Diode 218, preferably rated at 250 mW, and capacitors 215 and 225, preferably having values of 0.1 $\mu$f and 1.0 nf, respectively, are added to voltage divider circuit 200 as shown. Series resistor 240 and pull-up resistor 250 have the same values as series resistor 210 and pull-up resistor 220 in the preferred embodiment.

Window comparator circuit 300 is made up of two comparators 310 and 320 and associated resistors and capacitors as shown in FIG. 2. Inputs from voltage divider circuit 200 are labelled reference line 201 and speed line 203, as shown in FIGS. 2 and 3. Window comparator circuit 300 is configured to detect voltages outside the 0.4 vdc to 4.0 vdc range. Levels can be adjusted to provide guard bands to cover temperature hysteresis and Hall effect sensor hysteresis due to manufacturing variability. For the present invention, diagnostic circuit 100 is adjusted to produce a fault detection at or above 4.5 vdc and at or below 0.2 vdc.

System controller 500 (which can be a microprocessor of conventional design) has four inputs: reference-short 501, speed 502, reference-open 503, and speed open/short 504. Faults detected by window comparator circuit 300 are identified to system controller 500 via the appropriate input. System controller 500 then provides the appropriate signal to indicators (not shown) so as to alert the vehicle operator that a problem exists. However, the four inputs could be connected directly to indicator lamps or the like if no system controller is in use.

The operation of the present invention is as follows.

First, if a short to ground fault condition occurs in power supply 412, current limiting resistor 361 allows "reference-short" system controller input 501 to become a logic 0, thus indicating the fault in the wiring to power supply 412 or in speed sensor 400.

If speed line 203 experiences an open circuit or loss of speed signal, the voltage on speed line 203 will fall below 0.2 vdc, which in turn will cause "speed open/short" system controller input 504 to switch to 5 vdc, identifying a fault and sending a signal to the appropriate indicator (not shown).

A short circuit to ground on speed line 203 will produce the same result as an open circuit or loss of speed signal described above.

Likewise, an open circuit in reference line 201 will cause the voltage on speed line 203 to fall below 0.2 vdc which causes "speed open/short" system controller input 504 to switch to 5 vdc identifying a fault and sending a signal to the appropriate indicator (not shown).

A short circuit to ground on reference line 201 will cause the voltage level on "reference-short" system controller input 501 to fall to about 0 vdc, identifying a fault and sending a signal to the appropriate indicator (not shown).

A short circuit of speed line 203 to reference line 201 or a short circuit of speed line 203 to battery (9–16 vdc) will cause the voltage level on speed line 203 to exceed 4.5 vdc which will cause the "speed" system controller input 502 to switch to 0 vdc, identifying a fault and sending a signal to the appropriate indicator (not shown).

A short circuit of reference line 201 to battery (9–16 vdc) will cause the voltage level on speed line 203 to exceed 4.5 vdc which will cause "reference-open" system controller input 503 to switch to 0 vdc, identifying a fault and sending a signal to the appropriate indicator (not shown).

Finally, the safety feature of the voltage divider circuit 290 in the alternate embodiment shown in FIG. 2 protects the circuit in the event that the wires to supply voltage terminal 410 and ground 420 are inadvertently reversed. In that case, diode 218 turns on and pulls reference line 201 low, causing "reference-short" system controller input 501 to switch to 5 vdc identifying a fault and sending a signal to the appropriate indicator (not shown).

Although the best mode contemplated by the inventor for carrying out the present invention as of the filing date hereof has been shown and described herein, it will be apparent to those skilled in the art that suitable modifications, variations, and equivalents may be made without departing from the scope of the invention, such scope being limited solely by the terms of the following claims.

What is claimed is:

1. A device for detecting a fault condition in a Hall effect sensor circuit, said device comprising:

a Hall effect sensor (400) comprising a first terminal (410) corresponding to supply voltage (411), a second terminal (420) corresponding to ground (421), and a third terminal (430) corresponding to output (431);

a voltage divider circuit (200) being connected to said Hall effect sensor (400), said voltage divider circuit including a reference signal line corresponding to the supply voltage of said Hall effect sensor and a speed signal line corresponding to an output of said voltage divider circuit, said voltage divider circuit (200) comprising:

a series resistor (210) being connected to the output (431) of said Hall effect sensor (400);

a pull-up resistor (220) being connected to said series resistor (210) and also being connected to the supply voltage (411) of said Hall effect sensor (400); and, a pull-down resistor (365 & 366) being connected between the ground (421) of said Hall effect sensor (400) and also being connected to said series and pull-up resistors (210 & 220);

a window comparator circuit (300) being connected to said voltage divider circuit (200), said window comparator circuit (300) comparing the output voltage of said voltage divider circuit (200) and the supply voltage of said Hall effect sensor (400) and generating a fault condition signal indicating a fault condition when an output voltage of said window comparator circuit (300) rises above a predetermined upper limit or falls below a predetermined lower limit; and, means for indicating when said window comparator circuit (300) generates the fault condition signal, said indicating means being connected to said window comparator circuit (300).

2. The device according to claim 1 further comprising a system controller (500), said system controller (500) being interfaced between said window comparator circuit (300) and said indicating means.

3. The device according to claim 1 wherein said series resistor (210) has a value of 685Ω, said pull-down resistor (220) has a value of 10KΩ, and said pull-up resistor (365 & 366) has a value of 40KΩ.

4. The device according to claim 1 wherein said voltage divider circuit (200) further comprises;

a diode (218) being connected from the supply voltage (411) to the ground (421);

a first capacitor (215) being connected from the supply voltage (411) to the ground (421); and, a second capacitor (225) being connected from the output (431) to the ground (421).

5. The device according to claim 1, wherein said Hall effect sensor (400) comprises a gear tooth sensor.

6. In a computer controlled four-wheel drive system for a vehicle, said four-wheel drive having a transfer case and a Hall effect gear tooth sensor circuit, a device for detecting a fault condition in said Hall effect gear tooth sensor circuit, said device comprising:

a Hall effect gear tooth sensor having a supply terminal, a ground terminal, and an output terminal, said sensor being located inside said transfer case of said four-wheel drive system;

a voltage divider circuit being connected to said sensor, said voltage divider circuit comprising:

a series resistor being connected to the output terminal of said Hall effect sensor;

a pull-up resistor being connected to said series resistor and also being connected to the supply terminal of said Hall effect sensor;

a pull-down resistor being connected to the ground terminal of said Hall effect sensor and also being connected to said series and pull-up resistors;

a diode being connected from the ground terminal to the supply terminal;

a first capacitor being connected from the ground terminal to the supply terminal;

a second capacitor being connected from the output terminal to the ground terminal;

a reference signal line corresponding to a supply voltage of said Hall effect sensor;

a speed signal line corresponding to an output of said voltage divider circuit;

means for comparing the output of said voltage divider circuit and the supply voltage of said Hall effect sensor to a predetermined upper value and a predetermined lower value and for generating a fault condition signal indicating a fault condition when an output voltage of said comparing means rises above the predetermined upper limit or falls below the predetermined lower limit, said comparing means being connected to said voltage divider circuit; and, means for indicating the fault condition when said comparing means generates the fault condition signal, said indicating means being connected to said comparing means.

7. The device according to claim 1, wherein the predetermined upper limit has a value of 4.5 vdc and the predetermined lower limit has a value of 4.0 vdc.

8. The device according to claim 4, wherein said diode (218) has a value of 250 mW, said first capacitor (215) has a value of 0.1 μf, and said second capacitor (225) has a value of 1.0 nf.

9. The device according to claim 6, wherein the predetermined upper limit has a value of 4.5 vdc and the predetermined lower limit has a value of 0.4 vdc.

* * * * *